United States Patent [19]

Shiota et al.

[11] Patent Number: 5,196,399
[45] Date of Patent: Mar. 23, 1993

[54] APPARATUS FOR PRODUCING OXIDE SUPERCONDUCTOR CABLE

[75] Inventors: Takao Shiota, Sakura; Hiroshi Hidaka, Tsukuba; Koichi Takahashi, Funabashi; Masahiro Sato, Yotsukaido; Osamu Fukuda, Narashino; Koichi Inada, Sakura, all of Japan

[73] Assignee: Fujikura Ltd., Tokyo, Japan

[21] Appl. No.: 740,947

[22] Filed: Aug. 6, 1991

Related U.S. Application Data

[62] Division of Ser. No. 178,264, Apr. 6, 1988, Pat. No. 5,093,311.

[30] Foreign Application Priority Data

Apr. 6, 1987 [JP] Japan .................................. 62-85152
Apr. 6, 1987 [JP] Japan .................................. 62-85153
Apr. 6, 1987 [JP] Japan .................................. 62-85154
Apr. 28, 1987 [JP] Japan .................................. 62-105570

[51] Int. Cl.$^5$ ........................ H01L 39/24; C23C 14/56
[52] U.S. Cl. .................................. 505/1; 204/192.24; 204/298.24; 204/298.35; 204/298.03; 505/731; 505/816; 505/740; 505/821
[58] Field of Search ................. 204/192.24, 298.24, 204/298.35, 298.03; 505/1, 731, 816, 740, 821

[56] References Cited

U.S. PATENT DOCUMENTS 4,530,750  7/1985  Aisenberg et al. ............. 204/298.24
4,842,704  6/1989  Collins et al. ................. 204/192.24

Primary Examiner—Aaron Weisstuch
Attorney, Agent, or Firm—Oblon, Spivak, McClelland, Maier & Neustadt

[57] ABSTRACT

A device for fabricating an oxide superconductor cable includes a spinning furnace for receiving a preform and spinning the preform into a glass fiber. The device further includes a sputtering apparatus for receiving the spun glass fiber and coating the glass fiber with an oxide superconductor film as well as a pulling mechanism for pulling the glass fiber.

5 Claims, 5 Drawing Sheets

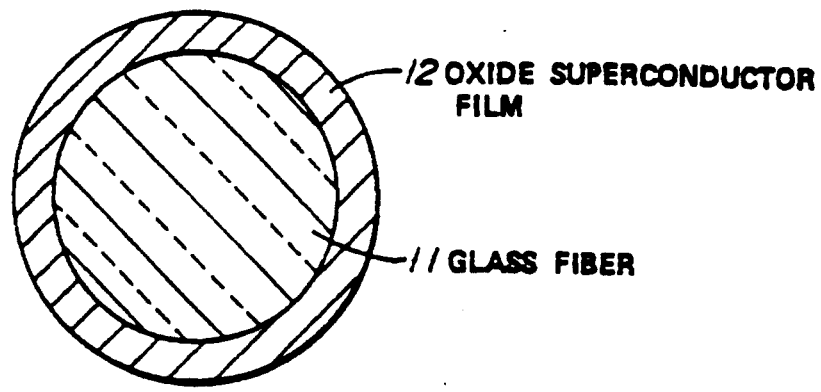
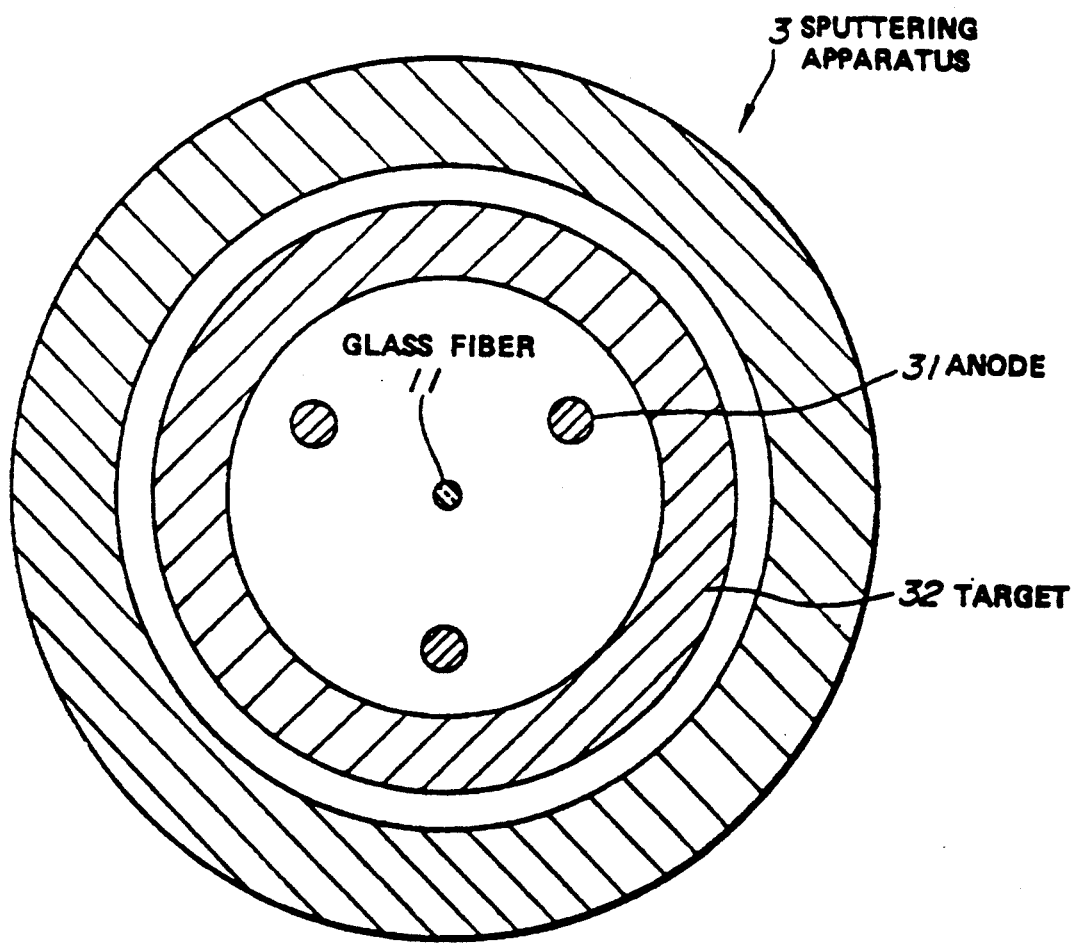

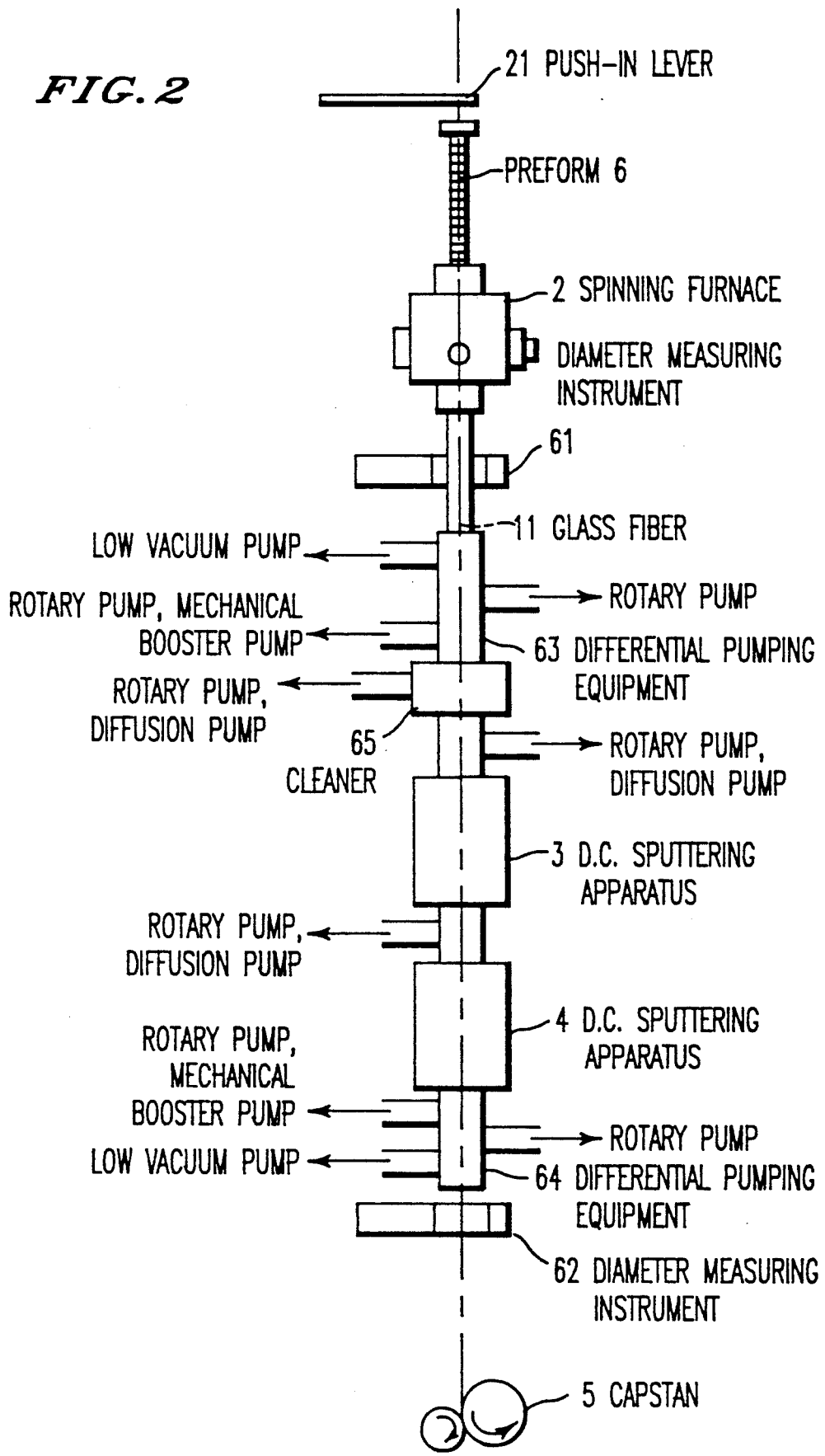

APPARATUS FOR PRODUCING OXIDE SUPERCONDUCTOR CABLE

This is a division of application Ser. No. 178,264, filed on Apr. 6, 1988, now U.S. Pat. No. 5,093,311.

BACKGROUND OF THE INVENTION

The present invention relates to an oxide superconducting cable and method of producing the same, which may be used, for example, for communication cables using superconductivity, superconducting magnet coils, and superconducting power transmission cables.

Various attempts have been made to produce a rod like oxide superconductor by extrusion molding a molten amorphous superconducting material, cooling and then heating it in an oxygen atmosphere.

However, such an oxide superconductor does not have sufficient flexibility for practical use as a cable. Furthermore, it is difficult to fabricate a thin cable of such a oxide superconductor.

Accordingly, it is an object of the present invention to provide an oxide superconductor cable and a method of producing the superconducting cable which is fairly thin and flexible as compared to the prior art oxide superconductor.

It is another object of the present invention to provide a method of fabricating oxide superconductor cable with ease.

SUMMARY OF THE INVENTION

In view of these and other objects, the present invention provides an oxide superconductor cable comprising a ceramic fiber and an oxide superconductor layer coated over the ceramic fiber. Such a construction of the cable to some extent provides flexibility to it and enables it to become relatively thin.

BRIEF DESCRIPTION OF THE DRAWINGS

In the drawings:

FIG. 1 is a diagrammatic cross-sectional view of an oxide superconducting cable fabricated according to the present invention;

FIG. 2 is a diagrammatic illustration of a production line of the superconducting cable of FIG. 1 with a modified scale;

FIG. 3 is an enlarged diagrammatic cross-sectional view of the sputtering apparatus in FIG. 2;

DETAILED DESCRIPTION OF THE PREFERRED EMBODIMENTS

Figure 4:
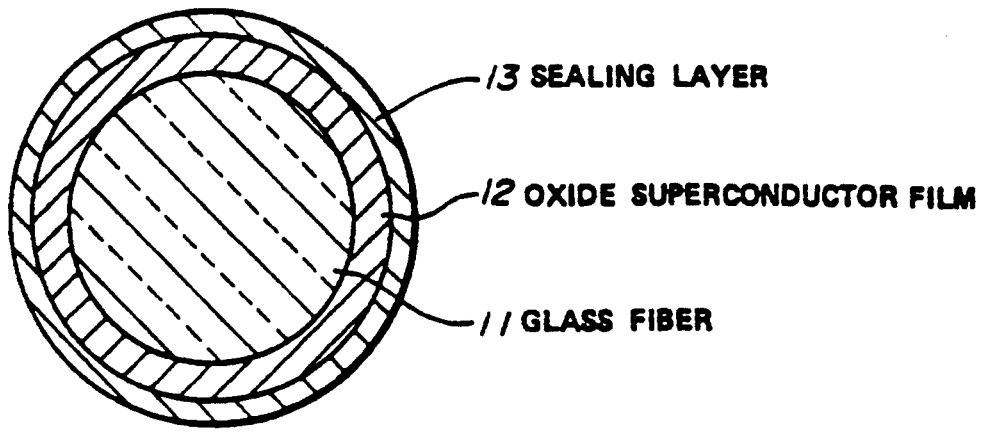
FIG. 4 is a diagrammatic cross-sectional view of a modified form of the superconducting cable in FIG. 1.

Referring to FIG. 1, an oxide superconductor cable of the present invention has a glass fiber 11 coated with an oxide superconductor film 12. In this embodiment, the glass fiber 11 is formed by spinning a silica glass into a fiber of 125 $\mu$m diameter. The oxide superconductor film 12 is made of an oxide superconductor $Ba_{0.6}Y_{0.4}CuO_4$ and has a thickness of 0.5 $\mu$m.

The glass fiber 11 may be made of a silica glass which includes 90 wt % or more of $SiO_2$ and further contains $GeO_2$, $B_2O_3$, $P_2O_5$, etc, and a conventional multi-component glass which includes $SiO_2$, $Na_2O$, $B_2O_3$, etc, and a similar glass and a ceramic.

The superconducting film 12 may be of other oxide superconductors such a La-Sr-Cu-O system and Ca-La-Cu-O system instead of Ba-Y-Cu-O system. More generally, the superconductor which is used in the present invention may be generally represented by the formula:

$$A_xB_yCu_zO_{9-\delta}$$

where: A includes at least one element of the IIIa group, i.e. Sc, Y, La, Ce, Pr, Nd, Pm, Sm, Eu, Gd, Tb, Dy, Ho, Er, Tm, Yb and Lu; B includes at least one element of the IIa group, i.e. Be, Sr, Mg, Ca, Ba and Ra; $0.1 \leq x \leq 2.0$; $1 \leq y \leq 3$; $1 \leq z \leq 3$; and $0 \leq \delta \leq 7$. Specifically, the Y-Ba-Cu-O system should be rhombic and typically x=1, y=2, z=3 and $2 < \delta < 3$. In the $(La_{2-k}Ba_k)CuO_4$ system, preferably $0 < k < 0.3$.

In the present invention, the glass fiber 11 may be fabricated by a conventional crucible drawing technique, a lot drawing technique, or and a similar method, and then coated with the oxide superconductor film 12. Such coating may be made by conventional methods such as, continuous sputtering, vacuum deposition, MBE, chemical vapor deposition (CVD) or MOCVD, and technique of decomposition of an alkoxide of each element of a superconductor. Furthermore, the film 12 may be formed by oxidizing a material applied over the glass fiber 11 by the above methods. Sputtering provides a uniform single crystal film over a thin glass fiber with ease. The thickness of the superconducting film made of systems above named by the current sputtering technique may be about 0.1 to about 5 $\mu$m.

In an alternative method of forming the oxide superconductor film 12, an oxide superconductor material film may be coated over the glass fiber 11 and then the material film may be oxidized in an active oxygen plasma gas to produce the oxide superconductor film 12. The oxidation of the material film may be made in such an atmosphere which is produced by generating direct current plasma or high frequency plasma at a vacuum level of $10^{-1}$ to $10^{-4}$ Torr and then by introducing oxygen gas. Then, the oxide superconductor film 12 and the glass fiber 11 are cooled.

Additionally, a protecting layer of silicone, an organic compound, such as ultraviolet-setting epoxy acrylate resin, and similar material may be conventionally coated over the oxide superconductor film 12 for protecting the latter. The protecting layer according to the present invention is typically about 10 to about 100 $\mu$m in thickness.

When the glass fiber 11 is an optical fiber for communication, the superconducting cable may be used for both communication and power supply.

The superconducting cable in FIG. 4 is distinct from the superconducting cable in FIG. 1 in that it is coated with a sealing layer 13 over the oxide superconductor thin film 12. The sealing layer 13 serves to hermetically seal the thin film 12 against the atmosphere for preventing $O_2$, $H_2O$, $CO_2$, etc from permeating into and adhering to the thin film, so that the superconductor may keep its performance after sputtering. The sealing layer 13 is preferably formed immediately after the production of the superconductor film 12 since the surface of the latter is active just after the production thereof and is liable to react with existing gases.

Instead of silicone, the sealing layer 13 may be made of various kinds of glasses, such as optical glass and silica glass, or metals such as In, Ag, Cu, Ni and Au. The sealing layer 13 may be formed by conventional methods such as sputtering and other similar methods for forming the oxide superconductor layer 12. When the sealing layer 13 is made of a metal, it is coated over the oxide superconductor layer 12 by sputtering, hot dipping and CVD. According to the present invention, the sealing layer made of materials above named may be about 0.02 to about 50 $\mu m$ in thickness. A thickness smaller than about 0.02 $\mu m$ may provide insufficient sealing performance to the sealing layer The hot dipping technique provides the upper thickness limit and sputtering may form a sealing layer of a thickness up to about 5 $\mu m$.

Also in this modified superconducting cable, a protecting layer of silicone, organic compounds or a like material may be formed over the sealing layer 13.

Figure 5:
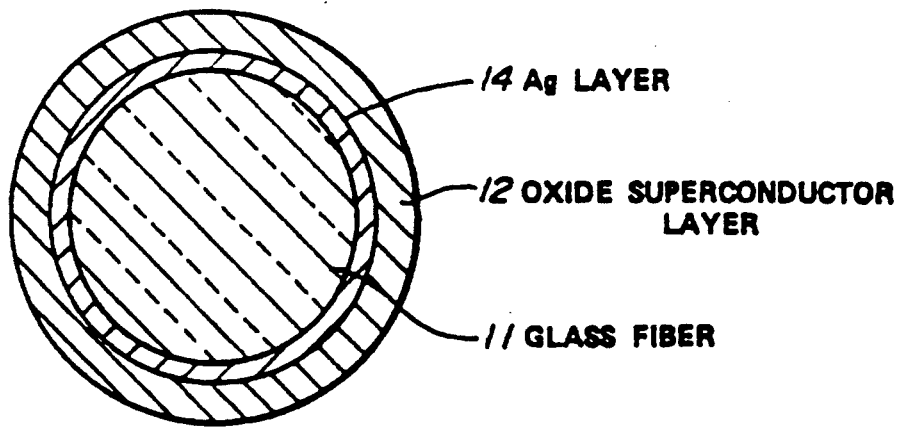
FIG. 5 is a diagrammatic cross-sectional view of another modified form of the superconducting cable in FIG. 1.

An improved form of the superconductor cable in FIG. 1 is illustrated in FIG. 5, in which the glass fiber 11 is coated with a nonoxidizing layer 14 of Ag, over which is coated the oxide superconductor layer 12. The non-oxidizing layer 14 serves to prevent elements of the oxide superconductor from reacting with components of the glass fiber 11 during heat treatment of the oxide superconductor, thus enhancing performance, e.g. critical temperature and critical current density, of the superconductor. Particularly, the non-oxidizing layer 14 prevents oxygen in the oxide superconductor from being taken away by the glass fiber 11.

The non-oxidizing layer 14 may be made of noble metals, such as Ag, Au, Pt, Ru, Rh, Pd, Os and Ir, other than Ag and noble metal alloys such as Ag alloys and Au alloys. Further, the non-oxidizing layer 14 may be made of other conventional non-oxidizing materials. The thickness of the non-oxidizing layer 14 is generally about 0.5 $\mu m$ to about 5 $\mu m$ and preferably about 1 $\mu m$. With less than about 0.5 $\mu m$, the reaction between the oxide superconductor and the glass fiber 11 may not be sufficiently prevented and a non-oxidizing layer having a thickness larger than 5 $\mu m$ is liable to separate from the glass fiber 11.

The non-oxidizing layer 14 may be formed by conventional surface treatment techniques such as chemical vapor deposition, vacuum deposition, sputtering and dipping.

Figure 6:
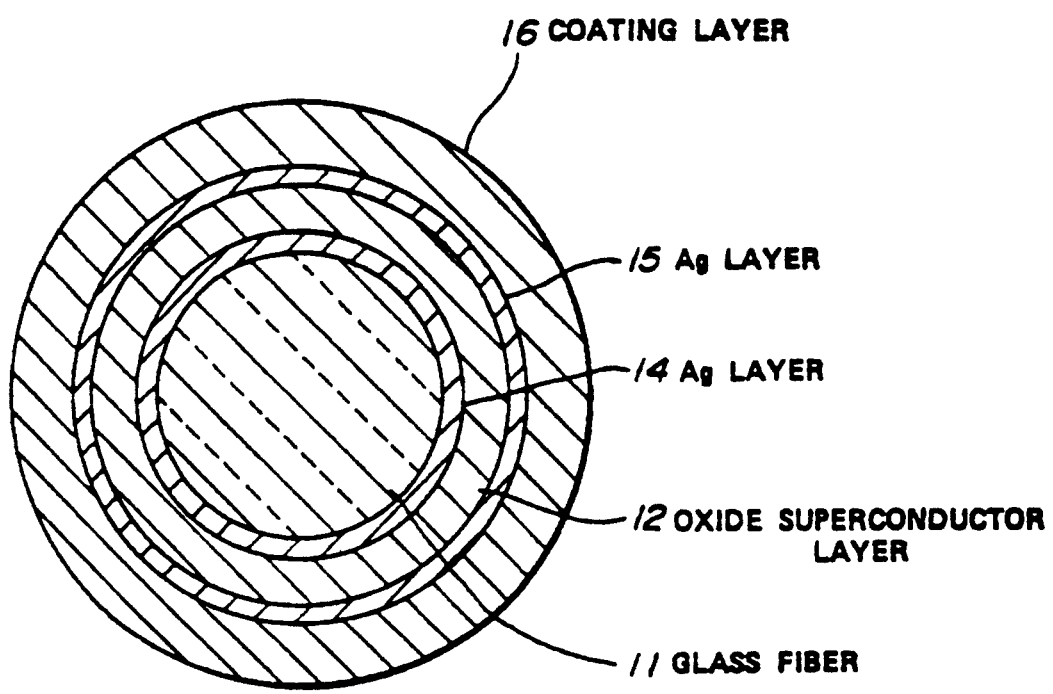
FIG. 6 is a diagrammatic cross-sectional view of a modified form of the superconductor cable of FIG. 5.

A modified form of the superconductor cable in FIG. 5 is illustrated in FIG. 6, in which the oxide superconductor layer 12 is coated with an oxidizing coating layer 16, such as a reinforcing layer or a stabilizing layer, through another non-oxidizing layer 15 of Ag. The Ag layer 15 serves to prevent oxygen from diffusing from the superconductor layer 12 into the coating layer 16.

Figure 7:
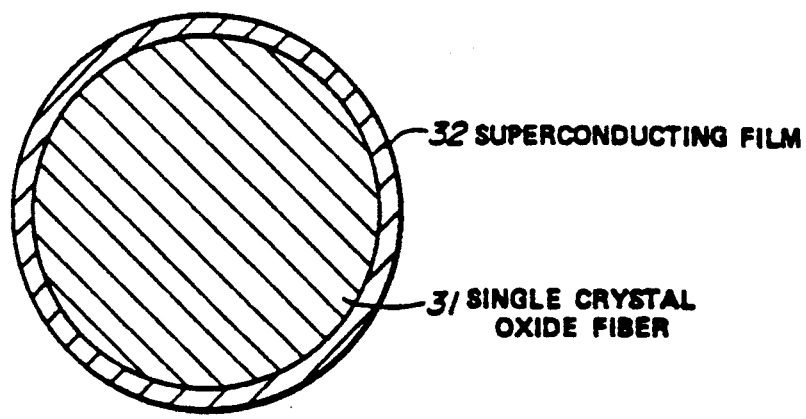
FIG. 7 is a diagrammatic cross-sectional view of another modified form of the superconductor cable in FIG. 1.

FIG. 7 illustrates a modified form of the superconducting cable in FIG. 1. In this modified superconducting cable, a single crystal oxide fiber 31 is coated with an oxide superconductor film 32. The single crystal structure of the fiber 31 provides an excellent effect in producing a uniform single crystal structure of the superconductor thin film 32.

Figure 8:
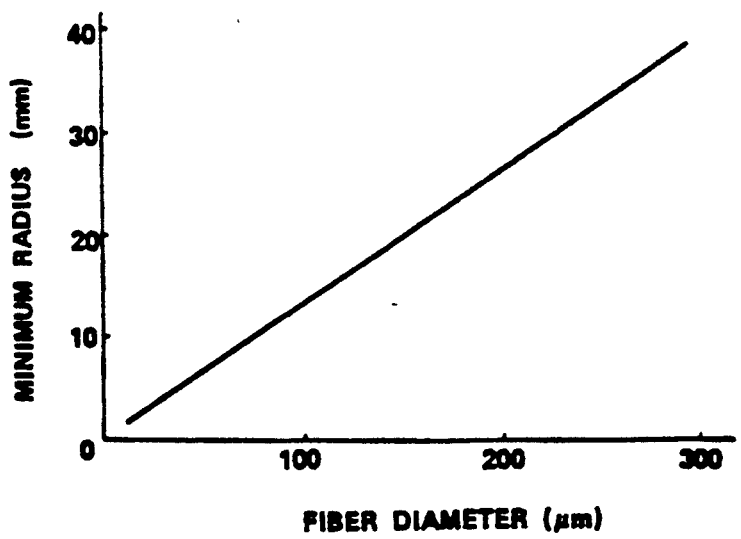
FIG. 8 is a graph showing the relationship between the diameter of a single crystal oxide fiber used in the superconductor cable in FIG. 7 and the minimum bending radius thereof.

The single crystal oxide fiber 31 may be $Al_2O_3$, $TiO_2$, $ZrO_2$, yttrium-aluminum-garnet (YAG) and other conventional materials. The diameter of the fiber 31 is preferably about 20 $\mu m$ to about 300 $\mu m$. With a diameter smaller than about 20 $\mu m$, it may be hard to handle it in production of the superconductor cable and beyond about 300 $\mu m$ it may not be sufficiently bent. FIG. 8 illustrates the relationship between the diameter of a sapphire single crystal fiber and the minimum radius of its loop which may be formed without breaking it. Such a thin single crystal oxide fiber 31 may be produced by a $CO_2$ laser pulling technique, Edge-defined Film Fed Growth (EFG) technique or The superconductor film 32 preferably has a thickness of less than about 2 $\mu m$ for preventing separation from the fiber 31 although it may have a thickness of about 5 $\mu m$. The superconductor film 32 may be formed in the same manner as the film 12.

The present invention may be applied to a multifilament type superconducting cable by assembling a plurality of single superconductor cables of the preceding embodiments in a sheath. The superconductor cable according to the present invention may have a rectangular cross-section or a like configuration and furthermore it may be in the shape of a tape.

EXAMPLE 1

A unit for fabricating an oxide superconductor cable according to the present invention is illustrated in FIG. 2, in which unit a conventional spinning furnace 2, sputtering apparatuses 3 and 4 and a capstan 5 are vertically aligned. A glass fiber 11 spun in the spinning furnace 2 is continuously introduced into the sputtering apparatuses 3 and 4 where it is coated with an oxide superconductor film as it is pulled by the capstan 5 for winding. The spinning furnace 2 spins the glass fiber 11 by drawing a molten glass supplied from a heating (not shown), furnace into which a preform 6 is pushed by a push-in lever 21 at a predetermined speed. The diameter of the glass fiber 11 is determined by a diameter measuring instrument 61, which provides an electric signal representative of the diameter according to which the push-in speed of the preform is changed by an electronic control unit (not shown) for providing a predetermined diameter In this example, a silica rod having a 20 mm diameter is used as the preform and the glass fiber 11 having 125 $\mu m \pm 2$ $\mu m$ diameter is spun and pulled at 1 m/min by the capstan 5.

The sputtering apparatuses 3 and 4 are respectively communicated to differential pumping devices 63 and 64, which are in turn connected to low vacuum pumps, rotary pumps and mechanical booster pumps. These pumps are arranged so that a vacuum degree in the differential pumping devices 63 and 64 become gradually higher towards the sputtering apparatus 3 and 4. A cleaner 65 is interposed between the differential pumping device 63 and the sputtering apparatus 3 for cleaning the surface of the glass fiber 11 by striking generated argon gas plasma against it. The sputtering apparatuses 3 and 4 are of the conventional double-hollow cylinder type, in which three anodes 31, 31, 31, as illustrated in FIG. 3, are arranged around the glass fiber 11 which is suspended through the center of the sputtering apparatus. A hollow cylindrical cathode target 32 is placed around the three anodes 31, 31, 31. The cathode target 32 is made by sintering an oxide powder of $Ba_{0.6}Y_{0.4}CuO_4$ and has an inner diameter of 40 mm, an outer diameter 50 mm and length 600 mm. In the sputtering apparatuses 3 and 4, argon gas is used at a pressure $10^{-3}$ Torr as plasma gas. The apparatuses 3 and 4 contain an atmosphere including 25% of $O_2$ and 75% of Ar. With such sputtering apparatuses 3 and 4, an oxide superconductor thin film is formed by continuous sputtering on the glass fiber of a diameter 125 $\mu$m which was spun at a speed of 1 m/min. The oxide superconducting film is controlled to have a thickness 0.5 $\mu$m by measuring it with another diameter measuring instrument 62. The superconductor cable exhibited a superconductivity at 85K and the critical current density was 1000 A/$cm^2$.

EXAMPLE 2

A superconducting cable as illustrated in FIG. 4 was prepared by using the fabrication line of FIG. 2 under the same conditions as in Example 1 except that the target 32 of the sputtering apparatus 4 was made of $SiO_2$ for forming a $SiO_2$ sealing layer 13 over the oxide superconducting thin film 12, the glass fiber 11 was pulled out from the furnace 2 at a speed of 2 m/min, and the $SiO_2$ layer was coated with a silicone layer of 50 $\mu$m thickness just after it was formed. The superconductor thin film 12 and the $SiO_2$ layer 13 were 0.3 $\mu$m and 0.05 $\mu$m in thickness, respectively. The superconducting cable exhibited superconductivity at 85K with a critical current density of 2000 A/$cm^2$.

EXAMPLE 3

Another superconducting cable as illustrated in FIG. 4 was prepared in the same manner and conditions as in Example 2 except that the glass fiber had a diameter of 80 $\mu$m, the superconducting thin film 12 was formed by a conventional high frequency sputtering apparatus, and that an indium sealing layer 13 having a thickness of 20 $\mu$m was formed at 150° C. by means of a conventional metal dipping apparatus. The finished superconducting cable exhibited superconductivity at 85K with a critical current density of 2000 A/$cm^2$.

EXAMPLE 4

Still another superconducting cable was prepared in the same manner and conditions as in Example 1 except that: the target 32 was of an oxide superconductor material $La_{1.7}Ca_{0.3}CuO$; the glass fiber 11 was spun at 2 m/min; a 0.2 $\mu$m oxide superconductor material layer was formed over the glass fiber 11 in the sputtering apparatus 3; and the sputtering apparatus 4 was replaced by a D.C. plasma generator which oxdized the superconductor material layer thus formed in an atmosphere in which oxygen was mixed into high frequency plasma generated at a vacuum degree of $2\times10^{-2}$ Torr. The superconductor film 12 was coated with a 50 $\mu$m silicone layer for preventing $H_2O$, $O_2$ and other gases from outside from adhering to the film 12. The finished superconductor cable showed superconductivity at 35K with a critical current density of 1000 A/$cm^2$.

EXAMPLE 5

A silica glass fiber having a diameter 25 $\mu$m was passed through molten Ag for forming a 2 $\mu$m Ag coating layer. Then, a $YBa_2Cu_3O_7$ layer was coated over the Ag coating layer, which was heated at 600° C., by sputtering in an atmosphere including 70% of Ar and 30% of $O_2$ with the sputtering apparatus 3. Thereafter, the glass fiber coated with the $YBa_2Cu_3O_7$ layer was heat treated at 900° C. for 3 hours. The superconductor thus formed had a critical temperature of 91K and a critical current density of 500 A/$cm^2$ at the temperature of liquid nitrogen in a zero field.

EXAMPLE 6

In the same manner as in Example 5, an optical communication type silica glass fiber having 125 $\mu$m diameter was coated with a 25 $\mu$m thick Ag layer and then a $YBa_2Cu_3O_7$ superconductor layer was formed over the Ag layer. The superconductor had a critical temperature of 91.5K and a critical current density of 530 A/$cm^2$ at the temperature of liquid nitrogen in a zero field.

EXAMPLE 7

In a $CO_2$ laser pulling apparatus, a sapphire fiber of 0.3 mm diameter was heated by applying a 15 W $CO_2$ laser beam and drawn into a sapphire single crystal fiber having a diameter of 300$\pm$5 $\mu$m, which was then introduced into a sputtering apparatus as illustrated at 3 in FIG. 2, where it was subjected to sputtering in a $10^{-3}$ Torr oxidizing atmosphere, including 75% of Ar and 25% of $O_2$, using a $Ba_{0.6}Y_{0.4}CuO_{2.5}$ powder target, while the fiber was axially vibrated at a speed of 0.2 mm/min. Thus, a $Ba_{0.3}Y_{0.7}CuO_4$ thin film of 0.8 $\mu$m thickness was produced and then coated with a 50 $\mu$m silicone coating, so that a superconducting cable having a 1.2 mm length was obtained.

The critical temperature and the critical current density at the temperature of liquid nitrogen in zero field were 90K and 900 A/$cm^2$, respectively.

COMPARATIVE TEST

An oxide superconductor cable was prepared in the same manner and conditions as in Example 5 except that the Ag layer was not provided. The critical temperature and the critical current density at the temperature of liquid nitrogen of the oxide superconductor were 89K and 60 A/$cm^2$, respectively.

What is claimed is:

1. A device for fabricating an oxide superconductor cable comprising:
   spinning furnace means for receiving a preform and spinning said preform into a glass fiber;
   a sputtering apparatus for receiving said spun glass fiber and coating said glass fiber with an oxide superconductor film;
   pumping means connected to said sputtering apparatus for controlling a vacuum degree at said sputtering apparatus;
   pulling means for pulling said glass fiber as it passes through said sputtering apparatus; and
   diameter measuring means for determining a diameter of the glass fiber after the glass fiber leaves the spinning furnace means;
   wherein said spinning furnace means, said sputtering apparatus and said pulling means are vertically aligned, and a plurality of pumping means are provided on each side of said sputtering apparatus so that the vacuum degree of said pumping means becomes gradually higher in the directions toward said sputtering apparatus.

2. The device according to claim 1, further comprising:
   cleaning means for cleaning the surface of the spun glass fiber by striking argon gas plasma against said glass fiber.

3. The device according to claim 1, wherein said pumping means between said spinning furnace means and said sputtering apparatus are arranged so that the vacuum degree of said pumping means becomes downwardly gradually higher in the direction toward said sputtering apparatus.

4. The device according to claim 1, wherein said pumping means between said sputtering apparatus and said pulling means are arranged so that the vacuum degree of said pumping means becomes upwardly gradually higher in the direction toward said sputtering apparatus.

5. A device for fabricating an oxide superconductor cable comprising:

spinning furnace means for receiving a preform and spinning said preform into a glass fiber;

sputtering means for receiving said spun glass fiber and coating said glass fiber with an oxide superconductor film;

pulling means for pulling said glass fiber as it passes through said sputtering means;

push-in means for pushing said preform into said spinning furnace means at a predetermined speed;

diameter measuring means for determining a diameter of the glass fiber after the glass fiber leaves the spinning furnace means and providing a signal indicative thereof such that the predetermined push-in speed of said push-in means is based on said signal; and pumping means connected to said sputtering means for controlling a vacuum degree at said sputtering means so that the vacuum degree is gradually higher in the directions toward said sputtering means;

wherein said spinning furnace means, said sputtering means, said pulling means, said push-in means, said diameter measuring means and said pumping means are vertically aligned.

* * * * *